(12) United States Patent
Sievers

(10) Patent No.: US 12,292,688 B2
(45) Date of Patent: *May 6, 2025

(54) HERRINGBONE MICROSTRUCTURE SURFACE PATTERN FOR FLEXOGRAPHIC PRINTING PLATES

(71) Applicant: Esko Software BV, Ghent (BE)

(72) Inventor: Wolfgang Sievers, Kremperheide (DE)

(73) Assignee: Esko Software BV, Ghent (BE)

( * ) Notice: Subject to any disclaimer, the term of this patent is extended or adjusted under 35 U.S.C. 154(b) by 0 days.

This patent is subject to a terminal disclaimer.

(21) Appl. No.: 18/717,235

(22) PCT Filed: Dec. 7, 2022

(86) PCT No.: PCT/IB2022/061893
§ 371 (c)(1),
(2) Date: Jun. 6, 2024

(87) PCT Pub. No.: WO2023/105446
PCT Pub. Date: Jun. 15, 2023

(65) Prior Publication Data
US 2025/0110410 A1    Apr. 3, 2025

Related U.S. Application Data

(60) Provisional application No. 63/286,684, filed on Jun. 6, 2024.

(51) Int. Cl.
*G03F 7/20* (2006.01)
*G03F 7/00* (2006.01)

(52) U.S. Cl.
CPC ............ *G03F 7/202* (2013.01); *G03F 7/0002* (2013.01); *G03F 7/2055* (2013.01)

(58) Field of Classification Search
CPC ....... G03F 7/202; G03F 7/0002; G03F 7/2055
(Continued)

(56) References Cited

U.S. PATENT DOCUMENTS 11,388,311 B2 * 7/2022 Morisse ................... H04N 1/52
11,825,056 B2 * 11/2023 Morisse ................... B41M 1/04
(Continued)

FOREIGN PATENT DOCUMENTS

EP    1557279 A2    7/2005
EP    3318413 A1    5/2018
(Continued)

OTHER PUBLICATIONS

Int'l Search Report (PCT/ISA/210) & Written Opinion (PCT/ISA/237) mailed on Apr. 11, 2023, by the European Patent Office in Int'l App. No. PCT/IB2022/061893. (14 pages).

*Primary Examiner* — Caleen O Sullivan
(74) *Attorney, Agent, or Firm* — Buchanan Ingersoll & Rooney PC

(57) ABSTRACT

A printing plate includes a defined image area having a microstructure pattern. The microstructure pattern is defined by a plurality of rows each having a plurality of diagonal oriented elevated line segments having orientations alternating between a positive angle in one row and a negative angle in an adjacent row, wherein each line segment has a first end aligned with a middle portion of and spaced apart from a first line of a first adjacent row and a second end aligned with a middle portion of and spaced apart from a second line of a second adjacent row. Processes, computer readable media programmed with instructions for performing the processes, and tools for making the printing plate are also described.

20 Claims, 7 Drawing Sheets

(58) Field of Classification Search
USPC .................................................. 430/273.1
See application file for complete search history.

(56) References Cited

U.S. PATENT DOCUMENTS

| | | | |
|---|---|---|---|
| 2015/0336370 A1* | 11/2015 | Wier ..................... | G03F 7/2041 |
| | | | 101/401.1 |
| 2016/0154308 A1 | 6/2016 | Fronczkiewicz et al. | |
| 2016/0355004 A1 | 12/2016 | Blomquist et al. | |
| 2019/0315141 A1 | 10/2019 | Morisse et al. | |
| 2021/0213770 A1 | 7/2021 | Taylor et al. | |
| 2021/0385353 A1 | 12/2021 | Morisse et al. | |

FOREIGN PATENT DOCUMENTS

| | | | |
|---|---|---|---|
| EP | 3429863 A1 | 1/2019 | |
| WO | 2017203034 A1 | 11/2017 | |

* cited by examiner

HERRINGBONE MICROSTRUCTURE SURFACE PATTERN FOR FLEXOGRAPHIC PRINTING PLATES

CROSS REFERENCE TO RELATED APPLICATIONS

This application is a U.S. National Phase of International Application No. PCT/IB2022/061893 filed Dec. 7, 2022, which claims priority to U.S. Provisional Application Ser. No. 63/286,684, filed Dec. 7, 2021, which is incorporated herein by reference in its entirety.

BACKGROUND OF THE INVENTION

Flexographic printing using photopolymer printing plates has seen continuous improvement over the last decades. Around 2010, high intensity UV LEDs enabled creation of flat top dots, which have enabled further improvements of the ink transfer. While flat top dots were initially used to improve highlight dots in print, it was soon discovered they also could be used for creation of microstructures on the printing surface of a plate. Microstructured surface patterns can improve ink splitting during print, which can result in higher Solid Ink Density, lead to a more homogeneous ink film on the print substrate, less pinholes in the ink film, or combinations thereof.

One application for surface patterns include improving the print properties of process colors, by improving the definition of vignettes, smoothening tonal transitions, reducing dot gain, dot bridging and trailing edge voids, increasing Solid Ink Density (SID), and reducing pinholes in the ink film. Another application for surface patterns includes improving ink transfer for spot colors to provide higher SID, reduced pinholes and less mottling.

Spot colors are used, for example, to create a base for process colors on a transparent substrate (e.g. a white underprint), to produce color-accurate brand colors (e.g., the distinctive red color used by Coca Cola®), or as a sealing layer overprinted over process colors (e.g. on a transparent substrate).

Several patterns have been evaluated for this purpose. Most successful have been line patterns. In the field of flexographic printing with photopolymer plates microstructured printing surfaces, also called surface patterns or micro screens, are well known.

EP1557279 (Dewitte), incorporated by reference, discloses a so-called, "groovy pattern" comprising parallel lines. Groovy surface patterns comprise parallel lines oriented +45 or −45° with respect to imaging and printing direction. The lines of these patterns were typically several image pixels wide. These surface patterns were already applied years before the invention of Flat Top Dots. FIG. 1A shows an example of such surface pattern which is available in the screen libraries of Esko raster image processors (RIPs) as the "MG25" pattern.

The principle was mainly applied to digital photopolymer printing plates using a laser to write image information into a Laser ablateable mask (LAMs) on top of the polymer plate, but it also worked with analog photopolymer printing plates using film for transferring image information to the polymer plate. These patterns can also be directly engraved as three dimensional structures into elastomeric flexographic printing plates by laser ablation. This pattern may have some orientation sensitivity with respect to the imaging direction in some embodiments.

It is also known that the ink transfer of solid areas may be improved by overlaying high-percentage, high-line-count screens over the solid printing areas. For example, using a 516 LPI 73% screen instead of a 100% solid area may improve SID. Such a screen is shown in FIG. 1B. this surface pattern is available in the screen libraries of Esko RIPs as the "MC16P" pattern. This pattern was discovered and used early in the field of flexography when printers found that SID always dropped slightly when the raster screen turned from 99 to 100%.

After the advent of flat top dots, it was discovered that small dots generated by single pixel mask openings, imaged with "boosted" laser power, led to an even greater improvement in SID compared to the previous methods. FIG. 1E shows one example of a single pixel screen, available in the Esko RIP screen library as "MCWSI pattern n."

"Boosting" refers to increasing the laser power for a single pixel in the imaging direction relative to the power typically used for connected rows of pixels in the imaging direction. Flat top dot UV exposure of polymer plates allows creation of dots comprising only a single pixel, which in turn allows relatively higher line counts for the screens over a solid area. This concept is described in more detail in WO2017203034A1, incorporated herein by reference. This technology as described therein led to modified groovy patterns comprising single pixel lines as shown in FIGS. 1C and 1D. These Patterns are named "MG45" and "MG34," respectively, in the Esko RIP screen library.

It has been found that, especially for spot colors, where higher ink volumes need to be transferred to the print substrate, micro screen patterns comprising line structures can perform better than true single pixel structures, as is described in more detail in application U.S. Ser. No. 16/950,361, assigned to the assignee of the present invention, and incorporated herein by reference. Also, in narrow web print applications for label printing, line patterns are often preferred over true single pixel structures such as those depicted in FIG. 1G ("MCWSI") and FIG. 1H ("DDWSI").

Accordingly, there remains a need in the art for microstructure patterns that having an optimum combination of attributes for improving ink distribution on the print substrate and reducing pinholes in the ink film.

SUMMARY OF THE INVENTION

One aspect of the invention relates to a process for creating a printing plate for printing ink on a substrate, the printing plate having a printing surface for receiving ink. The process comprises defining an area of an image intended to print with ink, and applying a pattern to the defined area. The pattern comprises a plurality of rows each having a plurality of diagonal oriented elevated line segments having orientations alternating between a positive angle in one row and a negative angle in an adjacent row, wherein each line segment has a first end aligned with a middle portion of and spaced apart from a first line of a first adjacent row and a second end aligned with a middle portion of and spaced apart from a second line of a second adjacent row. In some embodiments, the first end is aligned on center with the first line of the first adjacent row and the second end is aligned on center with the second line of the second adjacent row. Each line segment in each row may be oriented perpendicular to adjacent line segments in adjacent rows. In some embodiments, each elevated line segment has an orientation selected from the group consisting of plus or minus 45-degrees and plus or minus 135-degrees with respect to the rows.

Each of the plurality of elevated line segments have a same number (M) of adjacent touching pixels in total and a same maximum number (T) of pixels arranged in a non-diagonal direction, such as wherein M is in the range of 3 to 5 and T=1, or wherein M=6 and T=2. Each of the plurality of line segments in a same row may be spaced apart from one another along a length of the row by a number(S) of pixels, wherein S is an odd number, such as wherein S=3 or 5, and in some embodiments, S=M. Each line segment may have a length in a range of 30 to 60 μm, such as in a range of 40 to 50 μm.

In some embodiments, comprising a first row of first elevated line segments, a second row of second elevated line segments, and a third row of third elevated line segments, the second row disposed adjacent to and between the first row and the third row, the first elevated line segments and the third elevated line segments oriented in a first direction, and the second row of elevated line segments oriented in a second direction different than the first direction, wherein at least some the first elevated line segments are aligned on a same diagonal line with at least some of the third elevated line segments.

In some embodiments, the pattern may include a first row of first elevated line segments, a second row of second elevated line segments, and a third row of third elevated line segments, the second row disposed adjacent to and between the first row and the third row, the first elevated line segments and the third elevated line segments oriented in a first direction, and the second row of elevated line segments oriented in a second direction different than the first direction, wherein none of the first elevated line segments align on a same diagonal line with any third elevated line segments.

In a process in which the printing plate is formed from a plate precursor comprising a LAMs layer disposed over a photocurable layer, the surface screen pattern may be applied to the photocurable layer by imaging the LAMs layer to form a mask and exposing the photocurable layer to actinic radiation through the mask, and developing the photocurable layer to form the printing plate.

In a process in which the printing plate is formed from a plate precursor comprising a photocurable layer, the process includes disposing a film comprising pattern information on the photocurable layer, exposing the photocurable layer to actinic radiation through the mask, and developing the photocurable layer to form the printing plate. In other processes in which the printing plate is formed from a plate precursor comprising a photocurable layer, the process includes forming a mask, exposing the photocurable layer to actinic radiation through the mask, developing the photocurable layer to form the printing plate, and applying the surface screen pattern to the photocurable layer by embossing. In a process in which the printing plate is formed from a plate precursor comprising an elastomeric layer, the process may comprise applying the pattern by laser engraving.

Another aspect of the invention relates to a printing plate, such as in some embodiments, a printing plate produced by of any the processes described above. In other embodiments, the invention relates a printing plate for printing ink on a substrate, the printing plate having a printing surface for receiving ink, the plate having a defined image area intended to print with ink and a pattern in the defined area forming the printing surface of the printing plate. The pattern includes a plurality of rows each having a plurality of diagonal oriented elevated line segments having orientations alternating between a positive angle in one row and a negative angle in an adjacent row, wherein each line segment has a first end aligned with a middle portion of and spaced apart from a first line of a first adjacent row and a second end aligned with a middle portion of and spaced apart from a second line of a second adjacent row. The printing plate may comprise an elastomeric printing plate or a photocured monomer or polymer. In printing plate embodiments comprising a photocured monomer or polymer, the pattern on the printing plate may be a pattern formed by exposing the plate to the pattern through a masking layer or a pattern formed by embossing the photocured monomer or polymer with the pattern.

Still another aspect of the invention relates to a computer implemented method of creating a bitmap for creating a printing plate for printing ink on a substrate. The method includes providing an image file comprising information defining areas of the plate intended to print with ink, providing a surface screen pattern, and superimposing the surface screen pattern over the image file. The surface screen pattern is defined by a plurality of rows each having a plurality of diagonal oriented line segments having orientations alternating between a positive angle in one row and a negative angle in an adjacent row, wherein each line segment has a first end aligned with a middle portion of and spaced apart from a first line of a first adjacent row and a second end aligned with a middle portion of and spaced apart from a second line of a second adjacent row. The surface screen pattern may be superimposed over the image file by conjugation.

Yet another aspect of the invention relates to a computer readable memory media product embodying non-transitory machine readable instructions corresponding to a bitmap produced by the method as described above.

Another aspect of the invention relates to a computer readable memory medium embodying non-transitory machine readable instructions for causing an imager to create an image on a mask or film for creating a printing plate. The instructions include information in the form of a bitmap file formed by the process of providing an image file comprising information defining areas of the plate intended to print with ink, providing a surface screen pattern, and superimposing the surface screen pattern over the image file. The surface screen pattern is defined by a plurality of rows each having a plurality of diagonal oriented line segments having orientations alternating between a positive angle in one row and a negative angle in an adjacent row, wherein each line segment has a first end aligned with a middle portion of and spaced apart from a first line of a first adjacent row and a second end aligned with a middle portion of and spaced apart from a second line of a second adjacent row;

Still another aspect of the invention relates to a tool for use in making a printing plate having a microstructured printing surface for receiving ink. The tool comprises a pattern applied to the tool, the pattern comprising a plurality of rows each having a plurality of diagonal oriented elevated line segments having orientations alternating between a positive angle in one row and a negative angle in an adjacent row, wherein each line segment has a first end aligned with a middle portion of and spaced apart from a first line of a first adjacent row and a second end aligned with a middle portion of and spaced apart from a second line of a second adjacent row. In some embodiments, the tool may be a mask or a film for use as a masking layer during an exposure step. In other embodiments, the tool may be an embossing cylinder, such as an embossing cylinder comprising metal, ceramic, or a combination thereof.

Yet another aspect of the invention relates to processes for making a printing plate having a microstructured printing surface for receiving ink. One process comprises providing the mask or film as described above disposed on a photocurable printing plate precursor, exposing the photocurable printing plate precursor to actinic radiation through the mask or film, and developing the printing plate from the plate precursor. Another process comprises providing the embossing cylinder as described above, providing a mask defining an image, providing a photocurable printing plate precursor, exposing the photocurable printing plate precursor to actinic radiation through the mask or film, developing the printing plate from the plate precursor to form elevated ink receiving areas; and embossing the microstructured printing surface on the elevated ink receiving areas using the embossing cylinder. The embossing step may include heating the embossing cylinder to a predetermined temperature and causing the embossing cylinder to come in contact with photocurable printing plate precursor. The embossing step may be performed before the exposure step or after the exposure step but before the development step.

DETAILED DESCRIPTION OF THE INVENTION

Figure 1A:
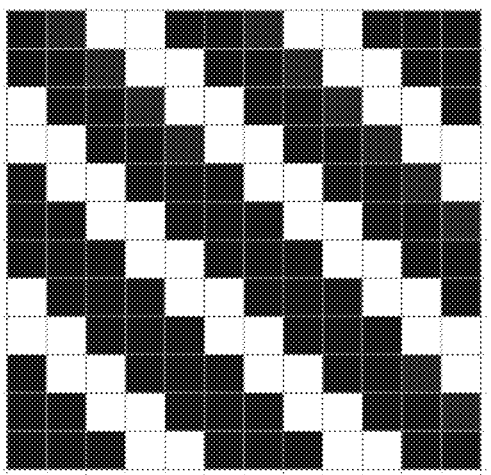
FIG. 1A is a diagram of a prior art "MG25" microstructure pattern, in which each white pixel corresponds to an elevated area on the resulting printing plate.
Figure 1B:
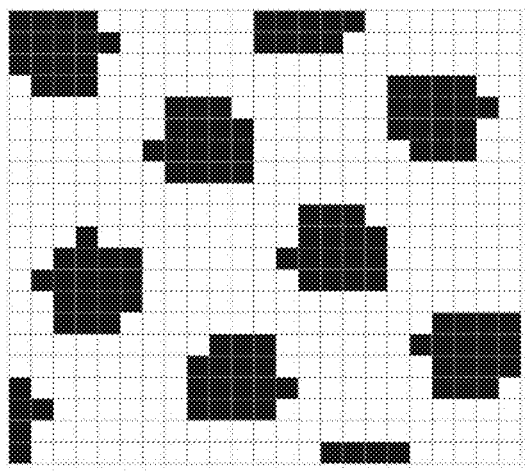
FIG. 1B is a diagram of a prior art "MC16P" microstructure pattern, in which each white pixel corresponds to an elevated area on the resulting printing plate.
Figure 1C:
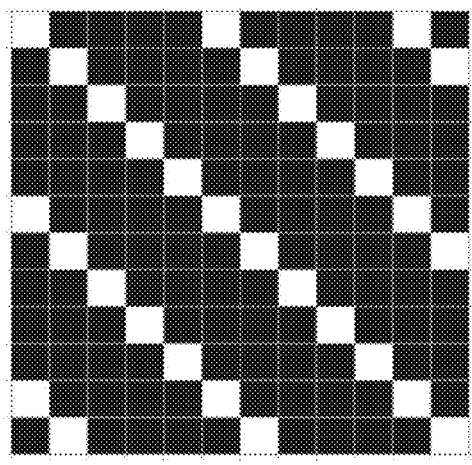
FIG. 1C is a diagram of a prior art "MG45" microstructure pattern, in which each white pixel corresponds to an elevated area on the resulting printing plate.
Figure 1D:
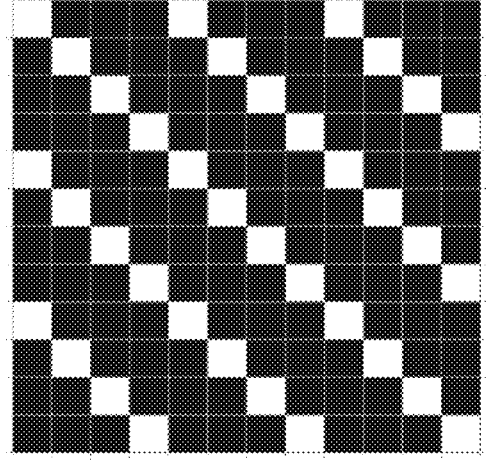
FIG. 1D is a diagram of a prior art "MG34" microstructure pattern, in which each white pixel corresponds to an elevated area on the resulting printing plate.
Figure 1E:
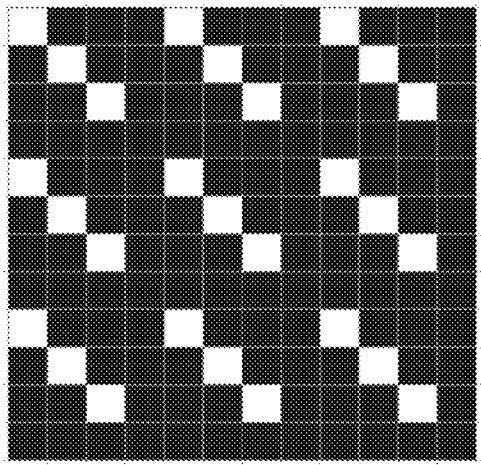
FIG. 1E is a diagram of a prior art "MCWSI pattern n" microstructure pattern, in which each white pixel corresponds to an elevated area on the resulting printing plate.

Applicant has extensively researched new print patterns for solid areas and has identified a number of attributes that are helpful for achieving optimum overall ink transfer.

1. Orientation Independency

Preferably surface patterns should have no dependency of ink transfer properties on the pattern orientation. Most preferably, they should be rotation symmetric and produce the same Solid Ink Density (SID) in both orientations when mounted parallel or perpendicular to the imaging direction to the print cylinder. The simplest way to obtain rotation symmetry is when the pattern itself is rotation symmetric, such as the patterns shown in FIG. 1F or FIG. 1G. But patterns having no true geometrical rotation symmetry may give identical print results in both possible orientations too, which is the case at least to a limited extent for the Groovy patterns in FIGS. 1A, 1C, 1D and 1E. The limitation of the latter is due to the patterns' imaging quality, which can differ depending on the orientation in the image file. Especially with imaging optics based on acousto-optical modulators, there may be a visible difference in the imaging quality due to the combination of the movements of the soundwave through the optical crystal and the movement of the LAMs on the rotation drum. At higher productivities associated with higher surface speed of the drum, the pixels imaged into the LAMs change from a circular to an elliptical shape. The longitudinal axis of the elliptical mask opening may be oriented parallel to direction of the line pattern or perpendicular to the orientation of the line pattern resulting in different mask openings. The strength of this effect increases with surface speed of the drum. Thus, these patterns have a limitation in imaging speed if orientation independency is required.

2. Pattern Repetition Size

The pattern should ideally have a small "pattern repetition size"—the size of the tile in pixels in the x and y direction of the base file resolution that can be placed next to another that will result in a continuation of the pattern free of interruptions. If the pattern repetition size is too large, it may be difficult to implement the pattern seamlessly into the screening tile of the RIP, causing visible seams of the macro tiles (i.e. the image screen supercells) generated by the RIP.

The pattern should ideally have a certain ratio between imaged and non-imaged pixels. A high number of pixels within a given area is preferable, but beyond some upper limit the pixels or pixel patterns start touching one another and lose their ink guiding properties. On the other hand, a pattern with too few imaged pixels may not improve ink transfer, and may end up being visible as individual elements in the print. At the same time, the absolute structure size of the pixel clusters that build a pattern is also a factor. It has been found that line structures on the printing plate having a length in direction of the pattern orientation between 30 and 60 µm, or more preferably between 40 and 50 µm, give the most improvement for ink transfer when used in a suitable pattern configuration.

3. Rugged Against Imaging Defects

As mentioned above, imaging quality may be dependent upon the line orientation, which makes certain patterns more suitable than others. Patterns oriented at 45° with respect to the imaging direction are more robust if they comprise equal amounts of +45° and −45° oriented lines, such as the patterns shown in FIG. 1F as compared to patterns that only comprise one angle orientation, such as the patterns of FIGS. 1C, 1D and 1E.

4. Good Ink Transfer Properties

One of the most important attributes for an ideal surface pattern is that it improves the ink transfer from printing plate to the print substrate. High SID is only one aspect of improved ink transfer. At the same time, the homogeneity of the printed ink film is important. The ink film should be free of pinholes or patterns visible to the human eye. Surface patterns may reduce the trailing edge problem that sometimes causes voids on printed areas in front of the edges where the printing cylinder lifts off the print substrate.

5. Compatible With Image Halftone Screening

Another important attribute is good compatibility with halftone screenings of the image file. Combining the surface screen with halftone screening of artwork file may produce artefacts, such as moiré patterns or tonal jumps in the halftone gradient and at the transition point to a 100% area. In order to avoid moiré patterns, image file halftone screening and surface screens are often combined by mathematical operations such as affine transformation, such as is described in US20190315141A1, incorporated herein by reference. Line surface patterns may not be ideal for such combining, because the size of the "basic tile" (the smallest tile that holds the complete pattern information and can be repeated in x and y direction while the pattern is reproduced without any disruption) may not fit in integer numbers into the image screen supercell that defines the image halftone screening. This can cause disruptions at the seams between the supercells.

Therefore, an alternative approach is to implement a surface screen regardless of the supercell size and its geometrical limitations simply by superimposing the screen over the image file by hardware or software conjugation. Not all types of surface screens are ideal for superimposing, and often moiré patterns are created by this way of combining.

Another consideration is the dot gain behavior of the surface screen. Dot gain is an effect in flexo printing that causes a halftone printing dots to print at a higher tonal value than the percentage size of the dot indicated in the image file, such as for example, a 50% dot that covers 70% of the printing substrate with ink. In order to correct this effect, the ink transfer function of a given image file halftone screen is characterized by a transfer curve. The transfer curve that describes the resulting tonal value in print versus the tonal percentage in the image file is referred to as a dot gain curve. An ideal dot gain curve is preferably a straight line without any disruptions, as disruptions present a tonal jump in print. In the real world, however, a dot gain curve is more curved than straight. Not all types of surface screens produce the same smooth transition from halftone screen to solid areas without visible tonal jumps. It is therefore an advantage to identify surface screens with no or only little tonal jumps and low curvature of the dot gain curve.

Herringbone Pattern

Figure 2A:
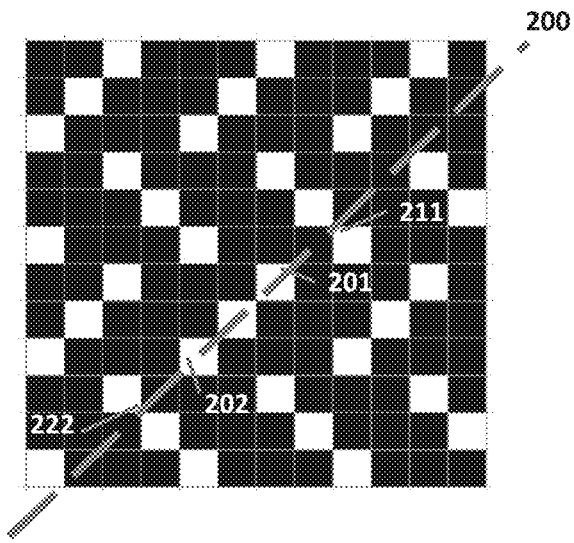
FIG. 2A is a diagram of an exemplary 3×3 herringbone microstructure pattern, in which each white pixel corresponds to an elevated area on the resulting printing plate.
Figure 2B:
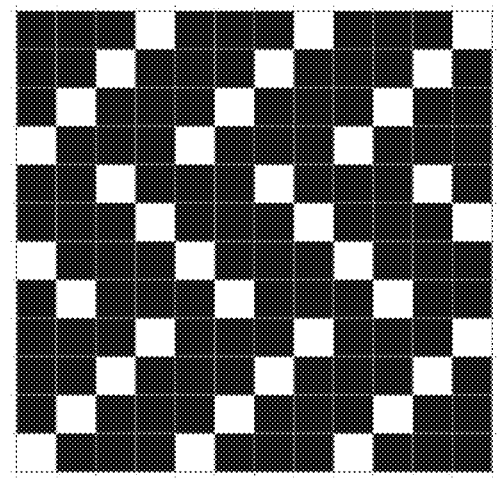
FIG. 2B is a diagram of an exemplary 4×3 herringbone microstructure pattern, in which each white pixel corresponds to an elevated area on the resulting printing plate.
Figure 2C:
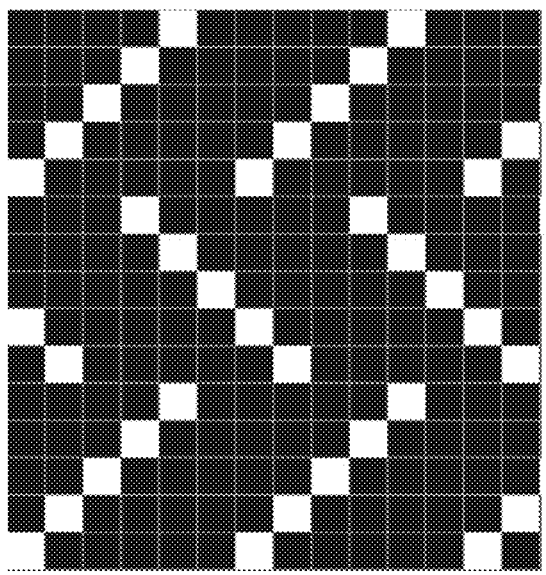
FIG. 2C is a diagram of an exemplary 5×5 herringbone microstructure pattern, in which each white pixel corresponds to an elevated area on the resulting printing plate.

Applicant's research for new print patterns for solid areas identified that patterns like those shown in FIG. 2A-2C can improve ink laydown in solid areas significantly and exhibit an optimum combination of the attributes listed above.

Figure 1F:
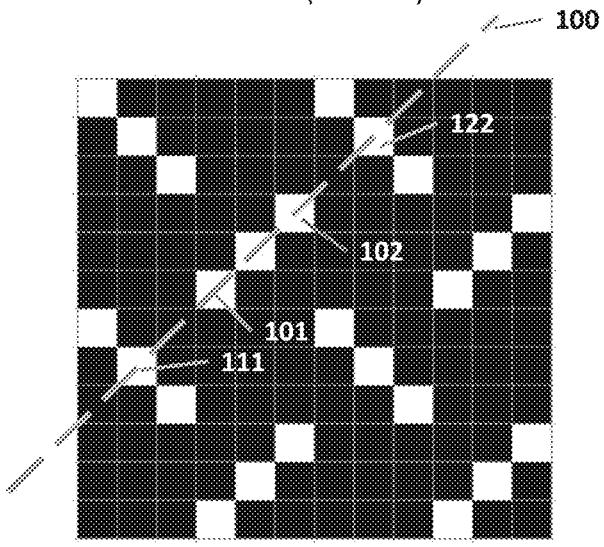
FIG. 1F is a diagram of a "cross-groovy" microstructure pattern, in which each white pixel corresponds to an elevated area on the resulting printing plate.
Figure 1G:
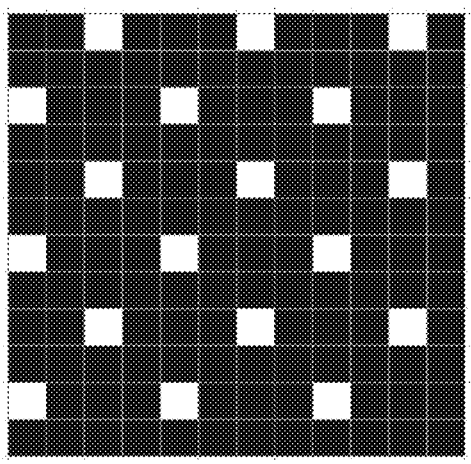
FIG. 1G is a diagram of a prior art "MCWSI" microstructure pattern, in which each white pixel corresponds to an elevated area on the resulting printing plate.

This pattern has been evolved from the "Cross Groovy" patterns shown and described in FIGS. 4A-4D of U.S. Ser. No. 16/950,361 (and FIG. 1F, herein), but differs due to its asymmetry with respect to the position of the perpendicular lines. In other words, whereas each 3-pixel dash in FIG. 1F is centered relative to the central pixel of each 3-pixel dash perpendicular thereto, each dash in FIGS. 2A-2C is not centered on the adjacent perpendicular dashes. Thus, while in all of FIGS. 1F and 2A-2C can be described as having each line segment with a first end 101/201 aligned on line 100/200 with a "middle portion" 111/211 of and spaced apart from a first line of a first adjacent row and a second end 102/201 aligned with a middle portion 122/222 of and spaced apart from a second line of a second adjacent row, wherein the term "middle portion" is defined as the area disposed between respective ends, only in the pattern of FIG. 1F is the first end 101 of each line segment aligned "on center 111 with" the first line of the first adjacent row and the second end 102 aligned "on center 122 with" the second line of the second adjacent row. The herringbone patterns of FIGS. 2A (36/144), 2B (28/144), and 2C (36/210) also have more imaged pixels per surface unit as compared the design depicted in FIG. 1F (24/144).

As the herringbone pattern is based on relatively coarse structures of line segments, and the orientation of the line segments is continuously altered, it has minimal to no orientation dependency of the image file during the imaging. Furthermore, imaging is not too demanding, which allows high imaging speed while still maintaining a good mask image quality.

The herringbone patterns are also capable of working with a wide boost range (the range of overpower for the laser beam when imaging the surface screen as compared to the power for conventional artwork images). For a conventional LAMs of a digital printing plate, the boost range can be calculated from the ablation energy required for removal of the LAMs. Common values for this ablation energy are 3.2 to 3.6 J/cm². During boosting, the energy input to the LAMs is typically increased in a range of 150-400%, depending on the requirements for print performance. This technique was developed and first used by Esko in order to optimize the ink transfer properties of a given micro screen for different print situations, which may be influenced by print substrate, anilox roll, ink type and viscosity, print speed etc.

Examples

The patterns shown in FIGS. 2A and 2C were tested on a McDermid ITP60 plate at an imaging resolution of 2540 DPI at 10 m²/h imaging speed on a CDI Crystal 4835. FIG. 3B shows the print result of the pattern of FIG. 2A.

Figure 3A:
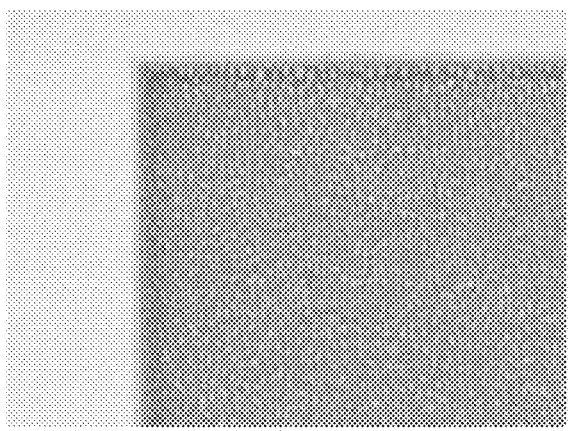
FIG. 3A depicts an approximately 6×8 mm area printed using a conventional solid printing surface having no microstructures.
Figure 3B:
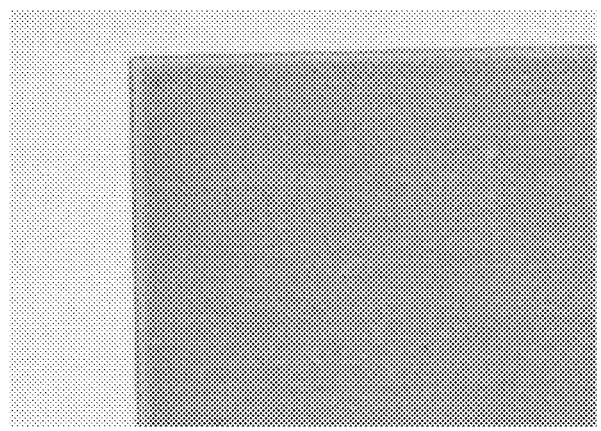
FIG. 3B depicts an approximately 6×8 mm area printed using the pattern of FIG. 2A.

FIG. 3A shows the same detail printed with a conventional solid printing surface having no structure. The picture detail depicted in FIGS. 3A and 3B is about 6×8 mm wide.

Figure 4:
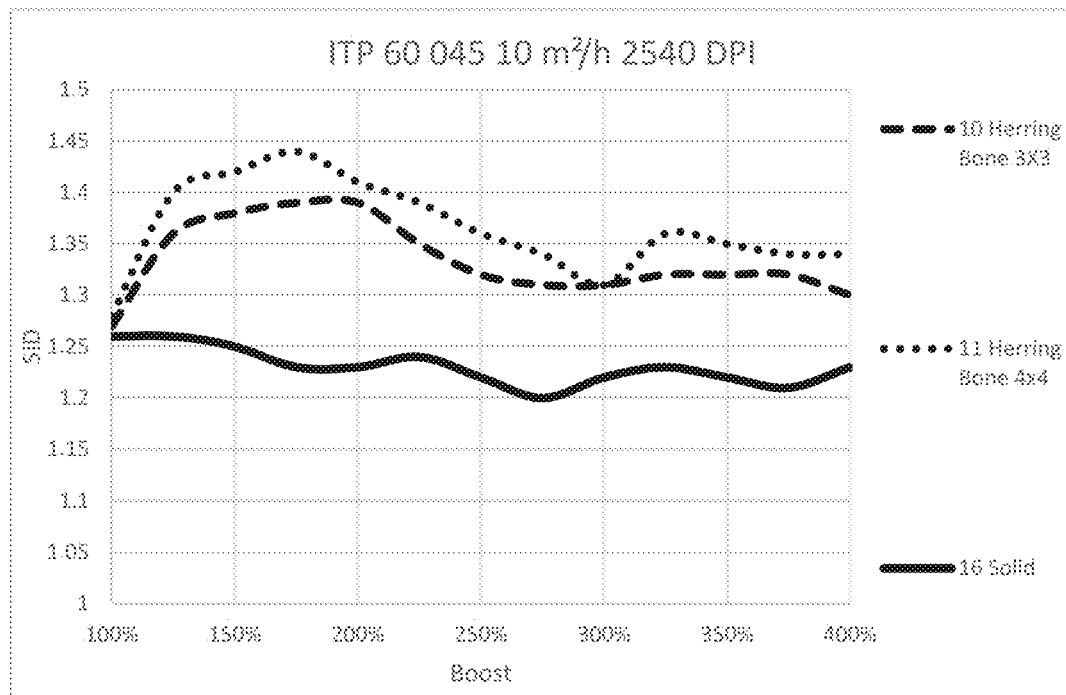
FIG. 4 is a graph showing the increase in Solid Ink Density (SID) for the Herringbone 3×3 pattern of FIG. 2A and the Herringbone 4×4 of FIG. 2B versus a standard non structured solid area for different boost settings.

FIG. 4 is a graph showing the increase in Solid Ink Density (SID) for the Herringbone 3×3 pattern of FIG. 2A and the Herringbone 4×4 of FIG. 2B versus a standard non structured solid area for different boost settings.

Figure 5:
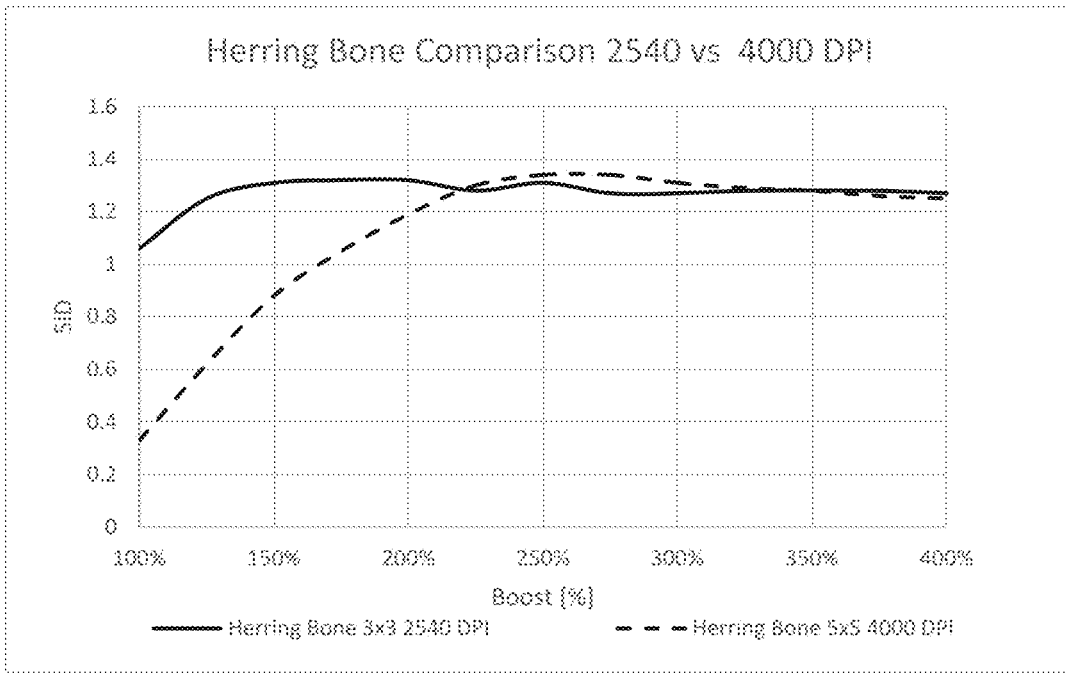
FIG. 5 is a graph showing a comparison of the SID of the Herringbone 5×5 pattern of FIG. 2C as compared to the Herringbone 3×3 pattern of FIG. 2A.

The Herringbone 5×5 pattern shown in FIG. 2C was tested at 4000 DPI image file resolution. FIG. 5 is a graph showing a comparison of the SID of the Herringbone 5×5 of FIG. 2C as compared to the Herringbone 3×3 pattern of FIG. 2A.

Another advantage of the Herringbone pattern is its ability to be combined with the image halftone screening by simple superimposing without causing strong moiré effects or tonal jumps over the grey tone scale. "Superimposing" in this case means that image file and micro screen are combined by a simple conjugation. Of course, the scope of this invention also includes combining the Herringbone surface screen with the image file by other mathematical methods, such as for example affine transformation.

Figure 1H:
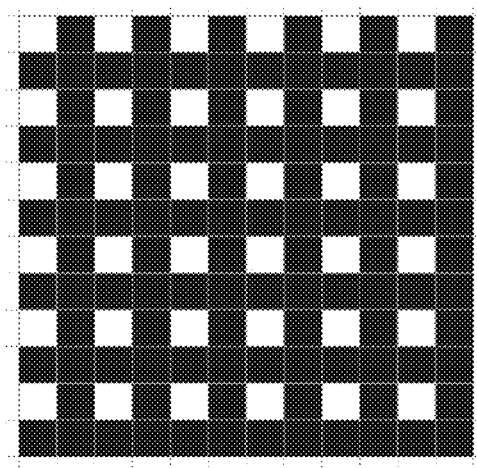
FIG. 1H is a diagram of a prior art "DDWSI" microstructure pattern, in which each white pixel corresponds to an elevated area on the resulting printing plate.
Figure 7:
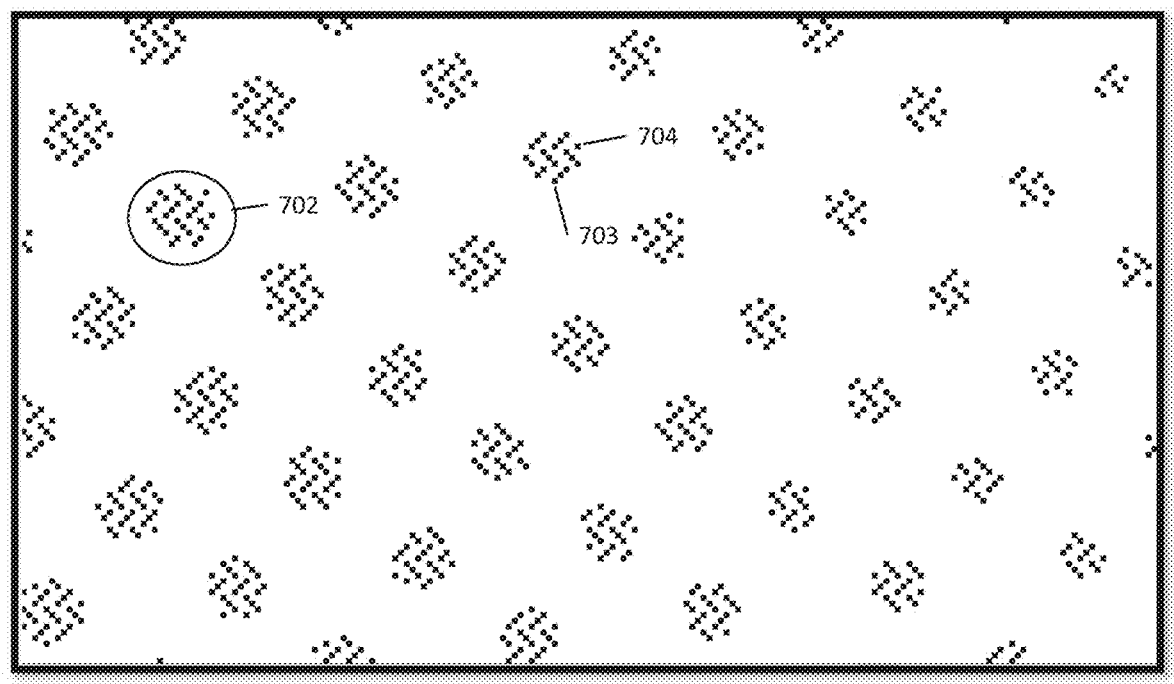
FIG. 7 depicts a screen formed by superimposing the 3×3 Herringbone microscreen of FIG. 2A over 110 LPI highlight screening dots at 2540 DPI file resolution.
Figure 8:
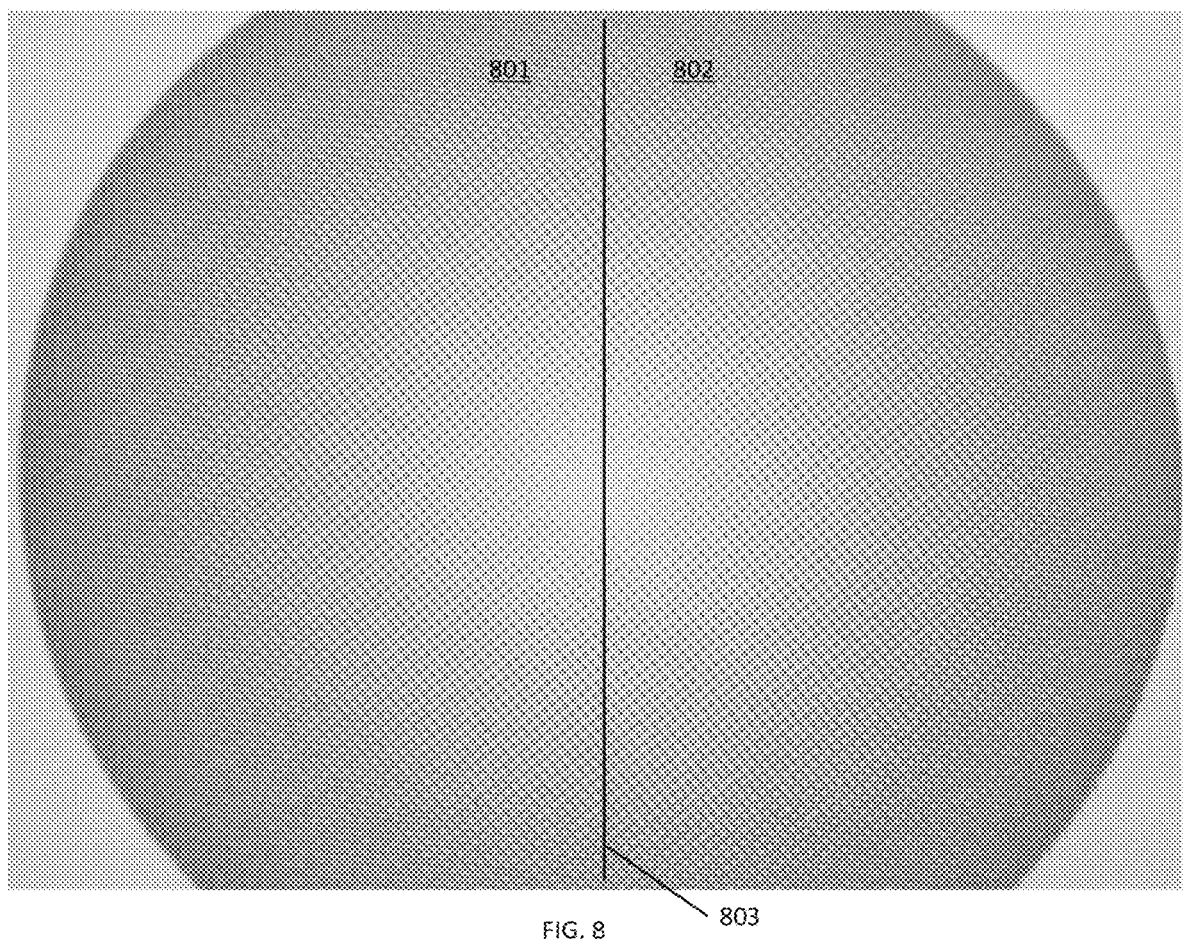
FIG. 8 depicts a comparison print result of a tonal transition from highlights to solids using the DDWSI pattern of FIG. 1H superimposed over 110 LPI highlight screening dots on the left and using the Herringbone pattern of FIG. 2A superimposed over the 110 LPI highlight screening dots on the right.

FIG. 7 depicts screening comprising superimposing a 3×3 Herringbone microscreen over 110 LPI highlight screening dots at 2540 DPI file resolution. FIG. 8 depicts the print result of a tonal transition from highlights to solids for the screening of FIG. 7. To the left of line 803 (area 801), the DDWSI pattern of FIG. 1H was superimposed over the 110 LPI highlight screening dots. To the right of line 803 (area 803), the Herringbone pattern of FIG. 2A was superimposed over the same 110 LPI highlight screening dots. As it can be seen from FIG. 8, the right side printed with the Herringbone microscreen shows less visible moiré effects compared to the left side printed with DDWSI pattern. While not tied to any single explanation as to why the Herringbone arrangement, which comprises essentially the same number of imaged pixels per surface unit as the DDWSI pattern, causes less moiré when superimposed over the highlight dots, the uncompleted lines 704 of the Herringbone pattern (built from line segments 703 comprising 3 pixels) are believed to cause varying patterns of imperfection that destroy the moiré condition typically caused by having two different grids with different periods. Regardless of the reason at the root cause for this observation, the Herringbone pattern applied to halftone screening in a manner as depicted in FIG. 7 reduces the visibility of Moiré effects known from other grid combinations in screening technology.

Figure 6A:
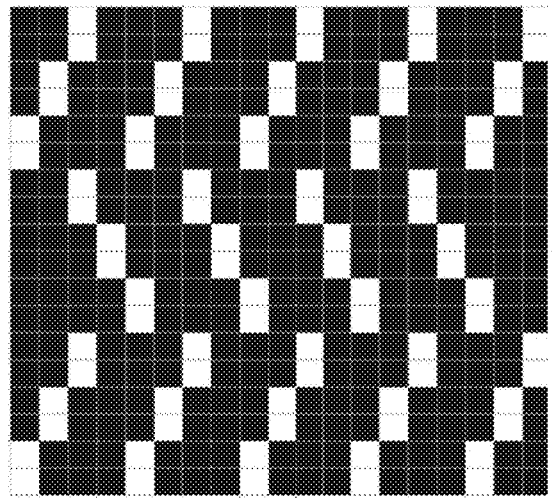
FIG. 6A is a diagram of an exemplary 6×3 herringbone microstructure pattern, in which each white pixel corresponds to an elevated area on the resulting printing plate, having connected pixels in a vertical direction.
Figure 6B:
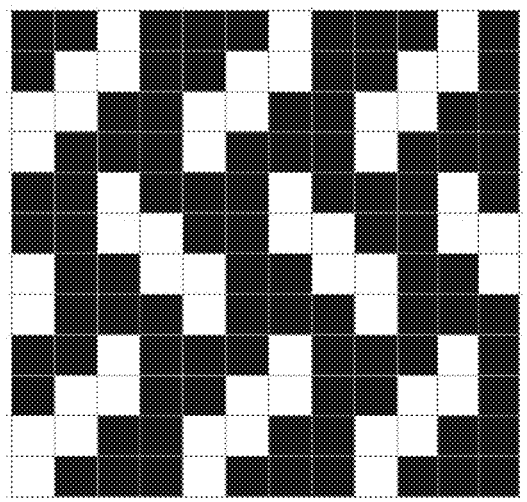
FIG. 6B is a diagram of an exemplary 6×3 herringbone microstructure pattern, in which each white pixel corresponds to an elevated area on the resulting printing plate, having connected pixels in both a vertical and horizontal direction.

Although all tested patterns were based on ±45° orientations, it should be understood that other angle orientations, such as for example depicted in FIG. 6A work based on the same principles. The pattern is also not limited to boosted imaging. Patterns comprised of several connected pixels may as well form a line-shaped printing structure arranged in a Herringbone pattern without a need for boosting individual pixels, such as the pattern depicted in FIG. 6B.

Use of the Herringbone pattern is also not limited to digital photopolymer printing plates. The pattern will as well work on an analog photopolymer plates on which the image is implemented by means of a film. The pattern is also not limited to polymer printing plates. It can also be ablated into elastomeric printing plates by means of laser engraving. Also, other transfer methods, such as embossing, may be applied. For example, the pattern may be placed as a negative 3-dimensional structure on an embossing cylinder. The embossing cylinder may be made of a metal, such as steel or cooper, optionally having a hardened surface comprising chrome or the like. Alternatively, the cylinder may be ceramic-coated, like an anilox roller, and the structure implemented by laser engraving. The cylinder is then heated and brought in contact with a polymer printing plate either before or after UV curing the photopolymer with the 3-dimensional printing structures as determined by the artwork image.

Although referred to herein generally as "photopolymer," it should be understood that applicable photocurable printing plates are not limited to any particular composition, including photocurable polymers and photocurable monomers, without limitation. The general processes for creating photocurable printing plates are well known in the art, but generally include disposing a mask over the photocurable layer (such as an imaged LAMs layer or film), exposing the photocurable polymer through the mask to actinic radiation (which radiation cures the photopolymer), and developing the plate, which may include removing the uncured photopolymer by washing, such as with an aqueous solution or an organic solvent, or by using thermal techniques, and performing finishing steps, including drying or exposure to detacking or hardening radiation.

The Herringbone pattern described herein may as well be applied to other image file resolutions beyond 2540 to 4000 DPI. Depending on the imaging resolution capabilities of the imager, the pattern may have a different resolution than the image file itself. The terms "microstructure pattern," microstructure surface screen pattern," "surface screen pattern," and "microstructure pattern" may all be used interchangeably herein, and without any particular meaning implied by use of the prefix "micro" or any particular method of forming the pattern implied by use of the term "screen." The term "microstructure" simply refers to surface structures that are present on surfaces of printing structures (areas intended to receive and apply ink) on the printing plate and are thus generally smaller in size than such printing structures and are superimposed over such printing structures, such as but not limited to areas of solid ink density and highlight areas. While the image may be defined by some isolated dots that are comparable in size to the microstructure size, it will be understood that most dots that define the image comprise a plurality of pixels, such that superimposition of microstructures as discussed herein to such image dots will typically result in the deletion of at least one or more of those pixels.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A process for creating a printing plate for printing ink on a substrate, the printing plate having a printing surface for receiving ink, the process comprising:
   defining an area of an image intended to print with ink;
   applying a microstructure surface screen pattern to the defined area, the microstructure surface screen pattern comprising a plurality of rows each having a plurality of diagonal oriented elevated line segments having orientations alternating between a positive angle in one row and a negative angle in an adjacent row, wherein each line segment has a first end aligned with a middle portion of and spaced apart from a first line of a first adjacent row and a second end aligned with a middle portion of and spaced apart from a second line of a second adjacent row.

2. The process of claim 1, wherein the first end of each line segment in the microstructure surface screen pattern is aligned on center with the first line of the first adjacent row and the second end is aligned on center with the second line of the second adjacent row.

3. The process of claim 1, wherein each line segment in each row in the microstructure surface screen pattern is oriented perpendicular to adjacent line segments in adjacent rows.

4. The process of claim 1, wherein the microstructure surface screen pattern includes each elevated line segment having an orientation selected from the group consisting of plus or minus 45-degrees and plus or minus 135-degrees with respect to the rows.

5. The process of claim 1, wherein the microstructure surface screen pattern includes each of the plurality of elevated line segments having a same number (M) of adjacent touching pixels in total and a same maximum number (T) of pixels arranged in a non-diagonal direction.

6. The process of claim 5, wherein M is in the range of 3 to 5 and T=1.

7. The process of claim 5, wherein M=6 and T=2.

8. The process of claim 6, wherein each of the plurality of line segments in a same row are spaced apart from one another along a length of the row by a number(S) of pixels, wherein S is an odd number.

9. The process of claim 8, wherein S=3 or 5.

10. The process of claim 9, wherein S=M.

11. The process of claim 1, wherein each line segment has a length in a range of 30 to 60 μm.

12. The process of claim 11, wherein the length is in a range of 40 to 50 μm.

13. The process ofclaim 1, wherein the microstructure surface screen pattern has a first row of first elevated line segments, a second row of second elevated line segments, and a third row of third elevated line segments, the second row disposed adjacent to and between the first row and the third row, the first elevated line segments and the third elevated line segments oriented in a first direction, and the second row of elevated line segments oriented in a second direction different than the first direction, wherein at least some the first elevated line segments are aligned on a same diagonal line with at least some of the third elevated line segments.

14. The process of claim 1, wherein the microstructure surface screen pattern has a first row of first elevated line segments, a second row of second elevated line segments, and a third row of third elevated line segments, the second row disposed adjacent to and between the first row and the third row, the first elevated line segments and the third elevated line segments oriented in a first direction, and the second row of elevated line segments oriented in a second direction different than the first direction, wherein none of the first elevated line segments align on a same diagonal line with any third elevated line segments.

15. The process of claim 1, wherein the printing plate is formed from a plate precursor comprising a LAMs layer disposed over a photocurable layer, wherein the microstructure surface screen pattern is applied to the photocurable layer by imaging the LAMs layer to form a mask and exposing the photocurable layer to actinic radiation through the mask, and developing the photocurable layer to form the printing plate.

16. The process of claim 1, wherein the printing plate is formed is formed from a plate precursor comprising a photocurable layer, the process comprising disposing a film comprising microstructure surface screen pattern information on the photocurable layer, exposing the photocurable layer to actinic radiation through the mask, and developing the photocurable layer to form the printing plate.

17. The process of claim 1, wherein the printing plate is formed from a plate precursor comprising a photocurable layer, the process comprising forming a mask, exposing the photocurable layer to actinic radiation through the mask, and developing the photocurable layer to form the printing plate, the process comprising applying the microstructure surface screen pattern to the photocurable layer by embossing.

18. The process of claim 1, wherein the printing plate is formed from a plate precursor comprising an elastomeric layer, the process comprising applying the microstructure surface screen pattern by laser engraving.

19. A printing plate for printing ink on a substrate, the printing plate having a printing surface for receiving ink, the plate having a defined image area intended to print with ink and a microstructure surface screen pattern in the defined area forming the printing surface of the printing plate, the microstructure surface screen pattern comprising a plurality of rows each having a plurality of diagonal oriented elevated line segments having orientations alternating between a positive angle in one row and a negative angle in an adjacent row, wherein each line segment has a first end aligned with a middle portion of and spaced apart from a first line of a first adjacent row and a second end aligned with a middle portion of and spaced apart from a second line of a second adjacent row.

20. The printing plate of claim 19, wherein the printing plate comprises a photocured monomer or polymer.

* * * * *

UNITED STATES PATENT AND TRADEMARK OFFICE
CERTIFICATE OF CORRECTION

PATENT NO. : 12,292,688 B2
APPLICATION NO. : 18/717235
DATED : May 6, 2025
INVENTOR(S) : Wolfgang Sievers Page 1 of 1

It is certified that error appears in the above-identified patent and that said Letters Patent is hereby corrected as shown below:

On the Title Page

In Related U.S. Application Data, Item (60) Provisional application No. 63/286,684, filed on Jun. 6, 2024: delete "Jun. 6, 2024" and insert -- Dec. 7, 2021. --

In the Claims

Column 11, Claim 13, Line 28: delete "ofclaim" and insert -- of claim --

Column 12, Claim 16, Line 13-14: delete "is formed is formed" and insert -- is formed --

Signed and Sealed this
First Day of July, 2025

Coke Morgan Stewart
*Acting Director of the United States Patent and Trademark Office*